(12) United States Patent
Johnson

(10) Patent No.: US 7,848,220 B2
(45) Date of Patent: Dec. 7, 2010

(54) SYSTEM FOR MODELING DIGITAL PULSES HAVING SPECIFIC FMOP PROPERTIES

(75) Inventor: J. Andrew Johnson, Newark Valley, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 923 days.

(21) Appl. No.: 11/092,153

(22) Filed: Mar. 29, 2005

(65) Prior Publication Data

US 2006/0227701 A1    Oct. 12, 2006

(51) Int. Cl.
    *H04J 11/00*    (2006.01)
(52) U.S. Cl. ............... 370/210; 370/203; 370/205; 370/212; 370/213
(58) Field of Classification Search .......... 370/210, 370/202, 203, 204, 205, 207, 212, 213, 215, 370/252, 350, 400, 401; 375/340, 316, 343, 375/242; 708/404, 405; 342/161, 162, 111, 342/116
See application file for complete search history.

(56) References Cited

U.S. PATENT DOCUMENTS

| | | | | |
|---|---|---|---|---|
| 3,646,480 A | * | 2/1972 | Spaulding | ............ 333/18 |
| 3,740,655 A | * | 6/1973 | Dickey, Jr. | ............ 327/94 |
| 3,745,317 A | | 7/1973 | Berthier et al. | |
| 3,745,571 A | * | 7/1973 | Chwastyk et al. | ............ 342/194 |
| 3,863,270 A | * | 1/1975 | Haley et al. | ............ 708/3 |
| 4,023,114 A | * | 5/1977 | Meixler | ............ 331/1 A |
| 4,039,930 A | * | 8/1977 | Lukas | ............ 323/213 |
| 4,083,008 A | | 4/1978 | Eschke | |
| 4,241,443 A | * | 12/1980 | Sakaki et al. | ............ 370/210 |
| 4,612,545 A | | 9/1986 | Asendorf et al. | |
| 4,672,638 A | * | 6/1987 | Taguchi et al. | ............ 375/346 |
| 4,715,000 A | | 12/1987 | Premerlani | |
| 4,739,279 A | | 4/1988 | Pion | |
| 4,749,995 A | * | 6/1988 | Hopwood et al. | ............ 342/371 |
| 4,907,087 A | | 3/1990 | Schreiber | |
| 4,999,799 A | | 3/1991 | Tufts | |
| 5,015,872 A | | 5/1991 | Rein | |
| 5,038,615 A | * | 8/1991 | Trulson et al. | ............ 73/597 |
| 5,109,188 A | | 4/1992 | Sanderson et al. | |
| 5,117,377 A | | 5/1992 | Finman | |
| 5,251,186 A | | 10/1993 | Lockwood | |
| 5,257,110 A | * | 10/1993 | Ohashi | ............ 386/90 |
| 5,309,161 A | * | 5/1994 | Urkowitz et al. | ............ 342/132 |
| 5,485,101 A | * | 1/1996 | Hynes | ............ 324/617 |

(Continued)

FOREIGN PATENT DOCUMENTS

EP    0398780 B1    1/1994

(Continued)

*Primary Examiner*—Aung S Moe
*Assistant Examiner*—Abdullah Riyami
(74) *Attorney, Agent, or Firm*—Tarolli, Sundheim, Covell & Tummino LLP

(57) ABSTRACT

A system samples data of a digital pulse. The system includes a processor, an integrator, and a converter. The processor computes a discrete Fourier transform of frequency data of the digital pulse. The discrete Fourier transform includes a first output. The integrator integrates the first output to produce phase data. The phase data includes a second output. The converter applies an inverse discrete Fourier transform to the second output to produce a continuous signal that may be sampled at a predetermined time instant.

20 Claims, 11 Drawing Sheets

U.S. PATENT DOCUMENTS

| | | | |
|---|---|---|---|
| 5,636,246 A * | 6/1997 | Tzannes et al. | 375/260 |
| 5,675,609 A | 10/1997 | Johnson | |
| 5,708,436 A * | 1/1998 | Loiz et al. | 342/25 A |
| 5,778,337 A * | 7/1998 | Ireton | 704/223 |
| 5,790,516 A * | 8/1998 | Gudmundson et al. | 370/210 |
| 5,793,820 A | 8/1998 | Vander Mey | |
| 5,832,414 A | 11/1998 | Hart et al. | |
| 6,049,298 A | 4/2000 | Knudsen | |
| 6,130,857 A * | 10/2000 | Williams et al. | 367/98 |
| 6,222,933 B1 * | 4/2001 | Mittermayer et al. | 382/109 |
| 6,367,043 B1 | 4/2002 | Damaria | |
| 6,499,004 B1 * | 12/2002 | Ohtsu et al. | 703/6 |
| 6,504,876 B1 | 1/2003 | Suto | |
| 6,614,373 B1 | 9/2003 | Frazier | |
| 6,989,782 B2 * | 1/2006 | Walker et al. | 342/134 |
| 7,020,074 B1 * | 3/2006 | Rickard et al. | 370/210 |
| 7,065,162 B1 * | 6/2006 | Sorrells et al. | 375/343 |
| 7,110,473 B2 * | 9/2006 | Miller et al. | 375/316 |
| 7,184,493 B1 * | 2/2007 | Pringle et al. | 375/316 |
| 7,230,879 B2 * | 6/2007 | Herkenhoff et al. | 367/47 |
| 7,363,219 B2 * | 4/2008 | Stachurski | 704/223 |
| 7,502,312 B2 * | 3/2009 | Zhang et al. | 370/210 |
| 2001/0031023 A1 | 10/2001 | Lye et al. | |
| 2002/0034161 A1 * | 3/2002 | Deneire et al. | 370/210 |
| 2002/0080889 A1 | 6/2002 | Dress et al. | |
| 2003/0061252 A1 * | 3/2003 | Murphy | 708/603 |
| 2003/0147655 A1 * | 8/2003 | Shattil | 398/182 |
| 2003/0154042 A1 | 8/2003 | Waldner | |
| 2004/0002856 A1 * | 1/2004 | Bhaskar et al. | 704/219 |
| 2004/0101046 A1 * | 5/2004 | Yang et al. | 375/240.08 |
| 2004/0252631 A1 * | 12/2004 | Park | 370/210 |
| 2005/0075869 A1 * | 4/2005 | Gersho et al. | 704/223 |
| 2005/0090274 A1 * | 4/2005 | Miyashita | 455/502 |
| 2005/0175076 A1 * | 8/2005 | Miller et al. | 375/150 |
| 2005/0225481 A1 * | 10/2005 | Bonthron | 342/175 |
| 2006/0193391 A1 * | 8/2006 | Borran et al. | 375/260 |
| 2007/0019744 A1 * | 1/2007 | Spahlinger | 375/242 |

FOREIGN PATENT DOCUMENTS

| | | |
|---|---|---|
| JP | 60029003 | 2/1985 |
| JP | 05308224 A | 11/1993 |
| WO | WO02087083 A1 | 10/2002 |

* cited by examiner

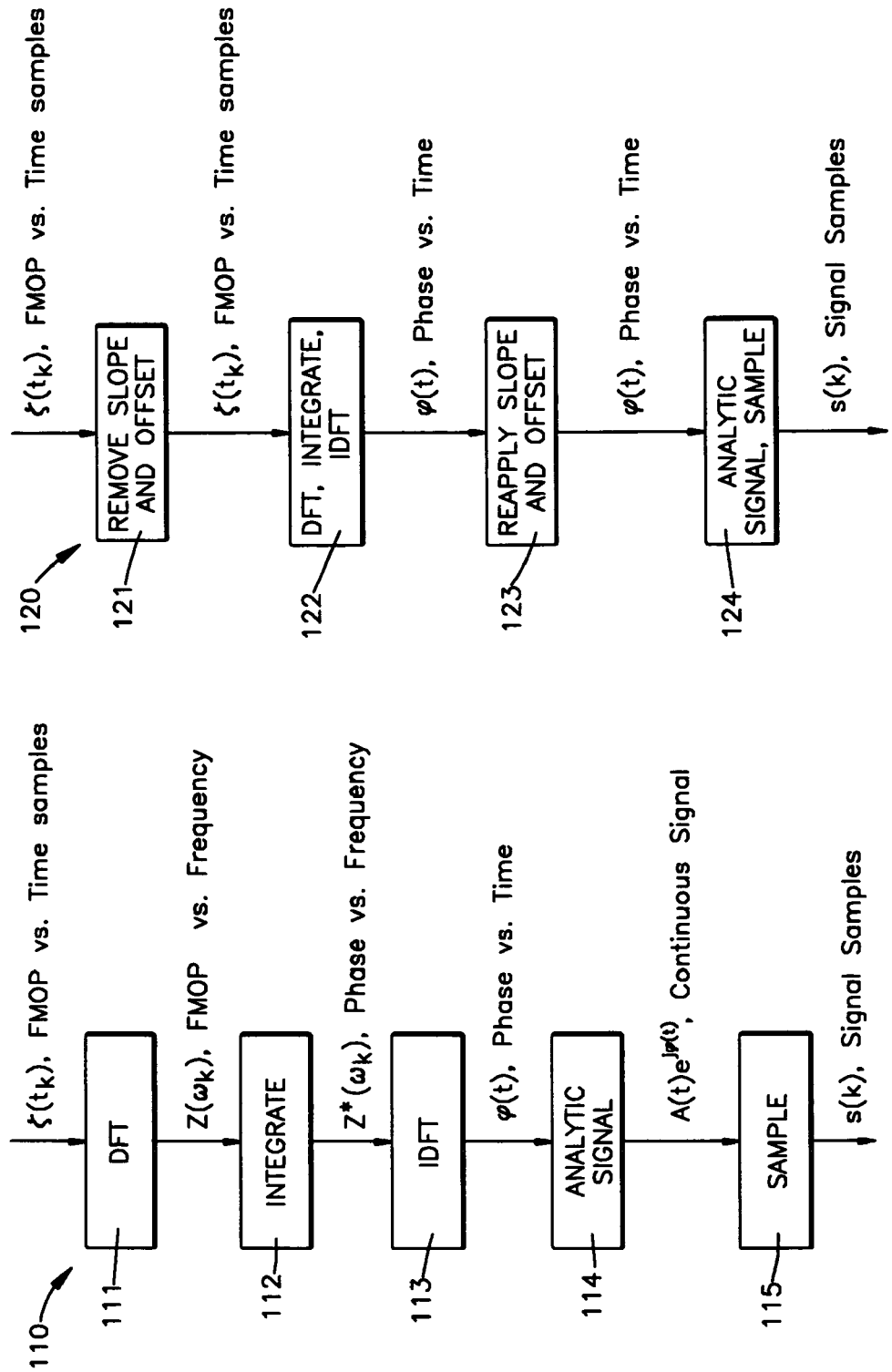

SYSTEM FOR MODELING DIGITAL PULSES HAVING SPECIFIC FMOP PROPERTIES

FEDERAL SPONSORSHIP

The U.S. Government has a paid-up license in this invention and the right, in limited circumstances, to require the patent owner to license others on reasonable terms as provided for by the terms of Contract No. N00019-00-G-0425 awarded by the U.S. Navy.

FIELD OF INVENTION

The present invention is directed to a system for modeling, and more particularly, to a system for modeling digital pulses having specific FMOP properties.

BACKGROUND OF THE INVENTION

Conventional signal processing techniques depend on measuring and comparing a Frequency Modulation on Pulse (FMOP) near the leading edge of a pulse waveform received by an electronic receiver. Particular FMOP properties may be imposed on the leading portion of a pulse by an algorithm. The algorithm may compute the sequence of digital samples required to generate a wave signature. It would be desirable to generate pulses with FMOP signatures that very closely match data collected on other platforms.

SUMMARY OF THE INVENTION

A system in accordance with the present invention samples data of a digital pulse. The system includes a processor, an integrator, and a converter. The processor computes a discrete Fourier transform of frequency data of the digital pulse. The discrete Fourier transform includes a first output. The integrator integrates the first output to produce phase data. The phase data includes a second output. The converter applies an inverse discrete Fourier transform to the second output to produce a continuous signal that may be sampled at a predetermined time instant.

A computer program product in accordance with the present invention samples data of a digital pulse. The computer program product includes a first instruction, a second instruction, and a third instruction. The first instruction computes a discrete Fourier transform of frequency data of the digital pulse. The first instruction produces a first output. The second instruction integrates the first output to produce phase data. The second instruction produces a second output. The third instruction applies an inverse discrete Fourier transform to the second output to produce a continuous signal that may be sampled at any predetermined time instant.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein:

FIG. 11 is a schematic representation of the example system in accordance with the present invention; and FIG. 12 is a schematic representation of another example system in accordance with the present invention.

DESCRIPTION OF AN EXAMPLE EMBODIMENT

Figure 1:
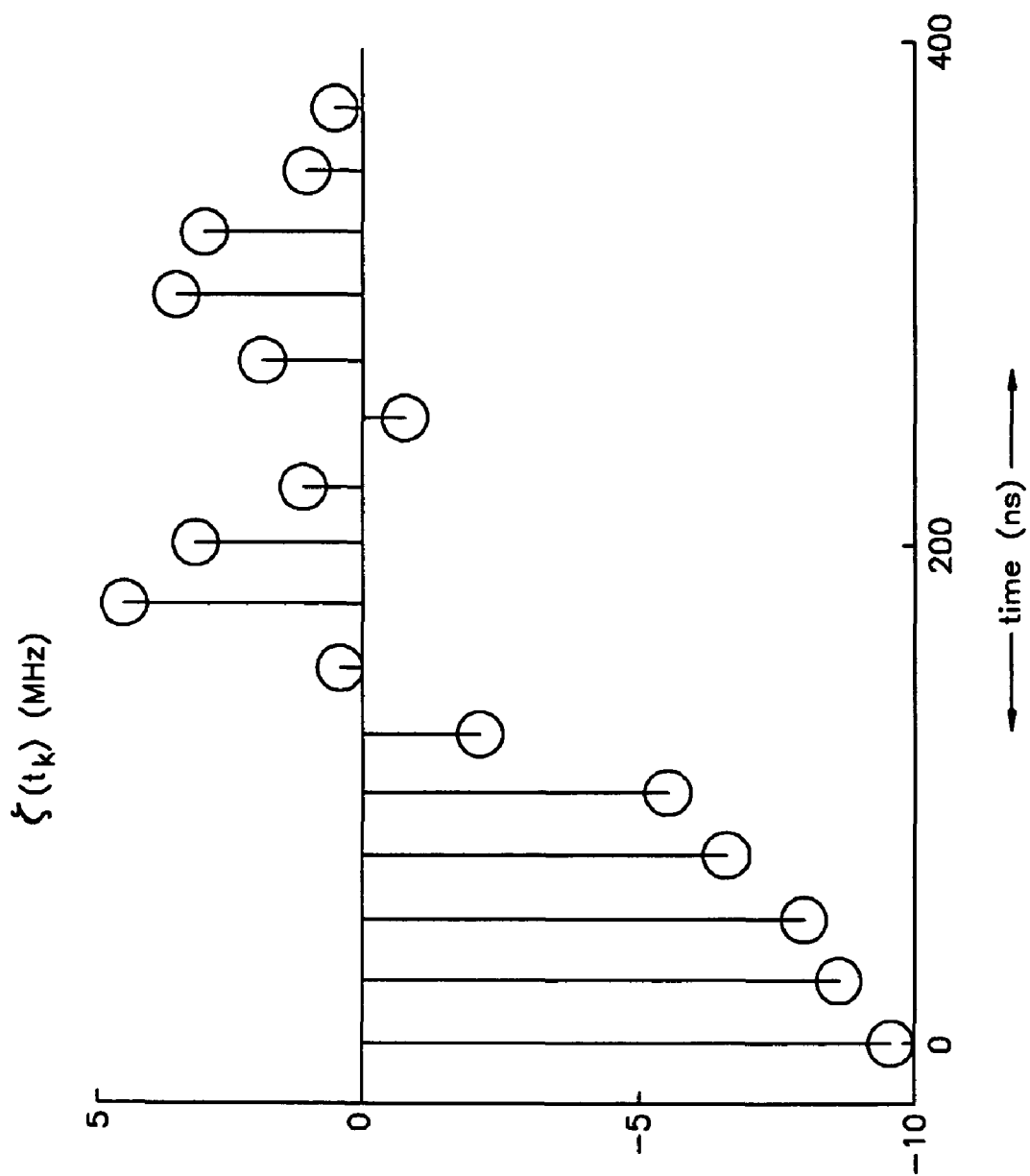
FIG. 1 is a schematic representation of data for use with an example system in accordance with the present invention.

A system in accordance with the present invention may model FMOP (instantaneous frequency) signal samples by a sum of continuous functions (sinusoidal and linear functions). The system may use Fourier techniques to integrate the signal to yield a phase. The system then may utilize the phase to create a complex digital waveform that has the original FMOP characteristics.

The system not only creates simple types of Frequency Modulation, such as Chirp (linear FMOP), PSK (Phase Shift Keying), etc., but also creates a pulse with arbitrary FMOP characteristics that are various points in the pulse.

An FMOP signature is presented as a series of instantaneous frequencies at uniform time intervals. The amplitude of a pulse is of little interest, and may be considered uniform. Since only the leading portion of the pulsed signal is of concern, the remainder of the pulse, beyond the point where the FMOP frequencies are defined, may be generated somewhat arbitrarily.

The system may represent a signal (i.e., a discrete series of FMOP values), via Fourier analysis, as a sum of sinusoids and a line (both continuous functions). Once this continuous function has been established, the function may be mathematically integrated to yield a phase, which may then be sampled at any point in time.

For an algorithm in accordance with the present invention, a frequency pattern is simply repeated successively for the duration of the pulse. This naturally follows from a frequency domain DFT (Discrete Fourier Transform) approach used by the system. A periodic waveform is implicit in this approach. One period may be the portion of the pulse for which the frequency is defined.

The system derives the analytic (i.e., complex-valued) samples based on a computed (instantaneous) phase for each point in time. The phase is related to the instantaneous frequency through integration. The transform is mechanized through the use of Fourier Transform techniques, with special attention placed on generating a periodic phase sequence with no discontinuities.

The instantaneous frequency (rad/s), $\zeta(t)$, of a signal may be defined as:

$$\zeta(t) = \frac{d}{dt}\phi(t)$$

where $\phi(t)$ is the phase (rad) of the signal. Thus, $$\phi(t) = \int_{\tau=0}^{t} \zeta(t)dt + \phi_0 \quad (1.1)$$

in which $\phi_0$ is some arbitrary initial phase.

A Discrete Fourier Transform (DFT) may transform an instantaneous frequency, having N samples (N even) at intervals $T_s$ into an alternate domain:

$$Z(w) = \Im\{\zeta(t_n)\} = \sum_{n=0}^{N-1} \zeta(t_n) e^{-jwt_n}, \, t_n = nT_s$$

and its inverse (IDFT) may be:

$$\zeta(t) = \Im^{-1}\{Z(w)\} = \frac{1}{N}\sum_{k=-\frac{N}{2}}^{\frac{N}{2}-1} Z(w_k) e^{jw_k t}, \, \omega_k = \frac{2\pi k}{NT_s} \quad (1.2)$$

Another property of the DFT may provide:

$$\zeta(t) = \Im^{-1}\{\Im\{\zeta(t_n)\}\} \quad (1.3)$$

A special symmetric version of the IDFT may be defined here, which may be mathematically identical to equation (1.2). The symmetric properties of the DFT produce $Z(\omega_{-N/2}) = Z(\omega_{N/2})$ Also, $e^{j\omega_{-N/2}t}$. And thus:

$$\zeta(t) = \frac{1}{N}\left[\sum_{k=-\frac{N}{2}+1}^{\frac{N}{2}-1} Z(\omega_k)e^{j\omega_k t} + \frac{Z\left(\omega_{-\frac{N}{2}}\right)e^{j\omega_{-\frac{N}{2}}t} + Z\left(\omega_{\frac{N}{2}}\right)e^{j\omega_{\frac{N}{2}}t}}{2}\right]$$

A continuous version of an FMOP signal, through "cosine interpolation", is thereby defined by the system. If the original continuous signal from which $\zeta(t_n)$ was constructed had been periodic in the interval sampled, $\zeta(t)$ would have been a perfect representation of the signal by the Nyquist Theroem, assuming a non-under-sampled signal. Combining equations (1.1) and (1.3) provides:

$$\phi(t) = \int_{\tau=0}^{t} \Im^{-1}\{\Im\{\zeta(t)\}\}dt + \phi_0$$

$$= \int_{\tau=0}^{t} \Im^{-1}\{Z(\omega)\}dt + \phi_0$$

$$= \int_{\tau=0}^{t} \frac{1}{N}\left[\sum_{k=-\frac{N}{2}+1}^{\frac{N}{2}-1} A(\omega_k)e^{j\omega_k t} + \frac{Z\left(\omega_{-\frac{N}{2}}\right)e^{j\omega_{-\frac{N}{2}}t} + Z\left(\omega_{\frac{N}{2}}\right)e^{j\omega_{\frac{N}{2}}t}}{2}\right]dt + \phi_0$$

$$= \frac{1}{N}\left[\sum_{k=-\frac{N}{2}+1}^{\frac{N}{2}-1} Z(\omega_k)\int_{\tau=0}^{t} e^{j\omega_k t}dt + \frac{Z\left(\omega_{-\frac{N}{2}}\right)\int_{\tau=0}^{t} e^{j\omega_{-\frac{N}{2}}t}dt + Z\left(\omega_{\frac{N}{2}}\right)\int_{\tau=0}^{t} e^{j\omega_{\frac{N}{2}}t}dt}{2}\right] + \phi_0$$

$$= \frac{1}{N}\left[\sum_{k=-\frac{N}{2}+1}^{\frac{N}{2}-1} Z(\omega_k)\frac{e^{j\omega_k t}-1}{j\omega_k} + \frac{Z\left(\omega_{-\frac{N}{2}}\right)}{2}\frac{e^{j\omega_{-\frac{N}{2}}t}-1}{j\omega_{-\frac{N}{2}}} + \frac{Z\left(\omega_{\frac{N}{2}}\right)}{2}\frac{e^{j\omega_{\frac{N}{2}}t}-1}{j\omega_{\frac{N}{2}}}\right] + \phi_0$$

This summation term may not be defined at $\omega_k=0=(k=0)$.

However, using L'hopital's Rule and taking the limit of $$\frac{e^{j\omega t}-1}{j\omega} \text{ as } \omega \to 0$$

yields t, so the k=0 term may receive special treatment. The last two terms in the brackets may cancel and be removed. Continuing, let $$Z^* = \begin{cases} 0, & \omega = 0 \\ 0, & \omega = \omega_{-\frac{N}{2}}, \\ \frac{Z(\omega)}{j\omega}, & \text{otherwise} \end{cases}$$

and so, $$\phi(t) = \frac{1}{N}\sum_{k=-\frac{N}{2}}^{\frac{N}{2}-1} Z^*(\omega_k)e^{j\omega_k t} - \frac{1}{N}\sum_{k=-\frac{N}{2}}^{\frac{N}{2}-1} Z^*(\omega_k) + \frac{Z(0)}{N}t + \phi_0$$

The first term may be recognized at the IDFT of $Z^*(\omega)$.

The second term may simply be the mean of the computed $Z(\omega_k)$ values, $\overline{Z^*}$. The third term may easily be shown to be the mean of the FMOP values, $$\overline{\zeta} = \frac{1}{N}\sum_{N=0}^{N-1}\zeta(t_n).$$

Finally, $$\phi(t)=\Im^{-1}\{Z^*(\omega)\}-\overline{Z^*}+\overline{\zeta}t+\phi_0.$$

In essence, the phase of the signal may be generated from the instantaneous frequency samples through integration via a transform domain.

As an interpretation, the N values of Z (Greek zeta) are the complex coefficients of the complex sinusoids defined by $e^{j\omega t}$ (i.e., Z represents the signal in the frequency domain). The process of dividing Z by $j\omega$ is equivalent to integration of the signal in the time domain, such that when $Z^*$ is transformed into the time domain, the original signal's integral may be derived.

One result of this approach may be that the signal component associated with $\omega_{N/2}$ is lost; it no longer appears in the equation for instantaneous phase. However, another, non-periodic term comes into being. $\overline{\zeta}$ may be viewed as a frequency offset, or the DC component of an instantaneous frequency signal.

The system assumes that an instantaneous frequency signal may be modeled as a periodic waveform. However, a discontinuity at the boundary between periods of the resultant phase function may result. The sinusoids generated by the system may always fit the data, but the transition across the periodic boundary may cause a large ripple in $\zeta(t)$, making $\zeta(t)$ highly sensitive to small time shifts. This ripple is caused by Gibb's Phenomenon. The algorithm thereby attempts to fit the step function at a boundary, which tends to result in the addition of larger, higher frequency components.

To mitigate this effect, the system combines the sinusoidal modeling with a small-order polynomial model, such as the instantaneous frequency signal, $\zeta(t)$, composed of periodic components (sinusoids) and linear components. The system removes the linear component from the signal before executing the sinusoidal approach described above. The linear frequency component is then injected back into a derived phase, $\phi(t)$, as a quadratic.

The system may model the signal as a periodic component plus a linear component:

$$\zeta(t)=\zeta(t)+\zeta_1 t+\zeta_0$$

The system may readily choose $\zeta_1$ and $\zeta_0$ through a least square fit:

$$S = N$$

$$S_x = \sum_{k=0}^{N-1} t_k = \frac{N(N-1)}{2}T_s$$

$$S_{xx} = \sum_{k=0}^{N-1} t_k^2 = \frac{N(N-1)(2N-1)}{2}T_s$$

$$S_y = \sum_{k=0}^{N-1} \zeta_k$$

$$S_{xy} = \sum_{k=0}^{N-1} \zeta_k t_k = T_s\sum_{k=0}^{N-1} k\zeta_k$$

$$\Delta = SS_{xx} - S_x^2$$

$$\zeta_1 = \frac{SS_{xx} - S_x S_y}{\Delta}$$

$$\zeta_0 = \frac{S_{xx}S_y - S_{xx}S_x}{\Delta}$$

and then $$\zeta(t)=\zeta(t)+\zeta_1 t+\zeta_0.$$

The algorithm described above may then be used on $\zeta(t)$ to determine $\phi(t)$. Integration of the linear components results in:

$$\phi(t) = \phi(t) + \frac{\zeta_1}{2}t^2 + \zeta_0 t.$$

Since the signal being modeled by the system may be defined only by its instantaneous frequency, information regarding the signal's amplitude envelope is superfluous. Thus, an amplitude envelope may arbitrarily be chosen, as follows:

$$A(t)=1-e^{-2.3t/t_R}$$

where $t_R$ is a desired exponential rise time. A composite signal, s(t), may become:

$$s(t) = A(t)e^{j\phi(t)}$$
$$= A(t)\cos\phi(t) + jA(t)\sin\phi(t)$$

with an in-phase and a quadrature signal component being separate terms. These terms may be sampled at an appropriate sample rate, such as a baseband digital I-Q modulator.

The system may also align phase and amplitude by adjusting a position of the phase component through a time shift of $t_{offset}$, $$s(t)=A(t)\cos\phi(t-t_{offset})+jA(t)\sin\phi(t-t_{offset}).$$

FIG. 1 illustrates an example frequency vs. time sequence for use by an example system in accordance with the present invention. If this were a continuous time function (instead of discrete time) it could be integrated to yield phase vs. time.

Figure 2:
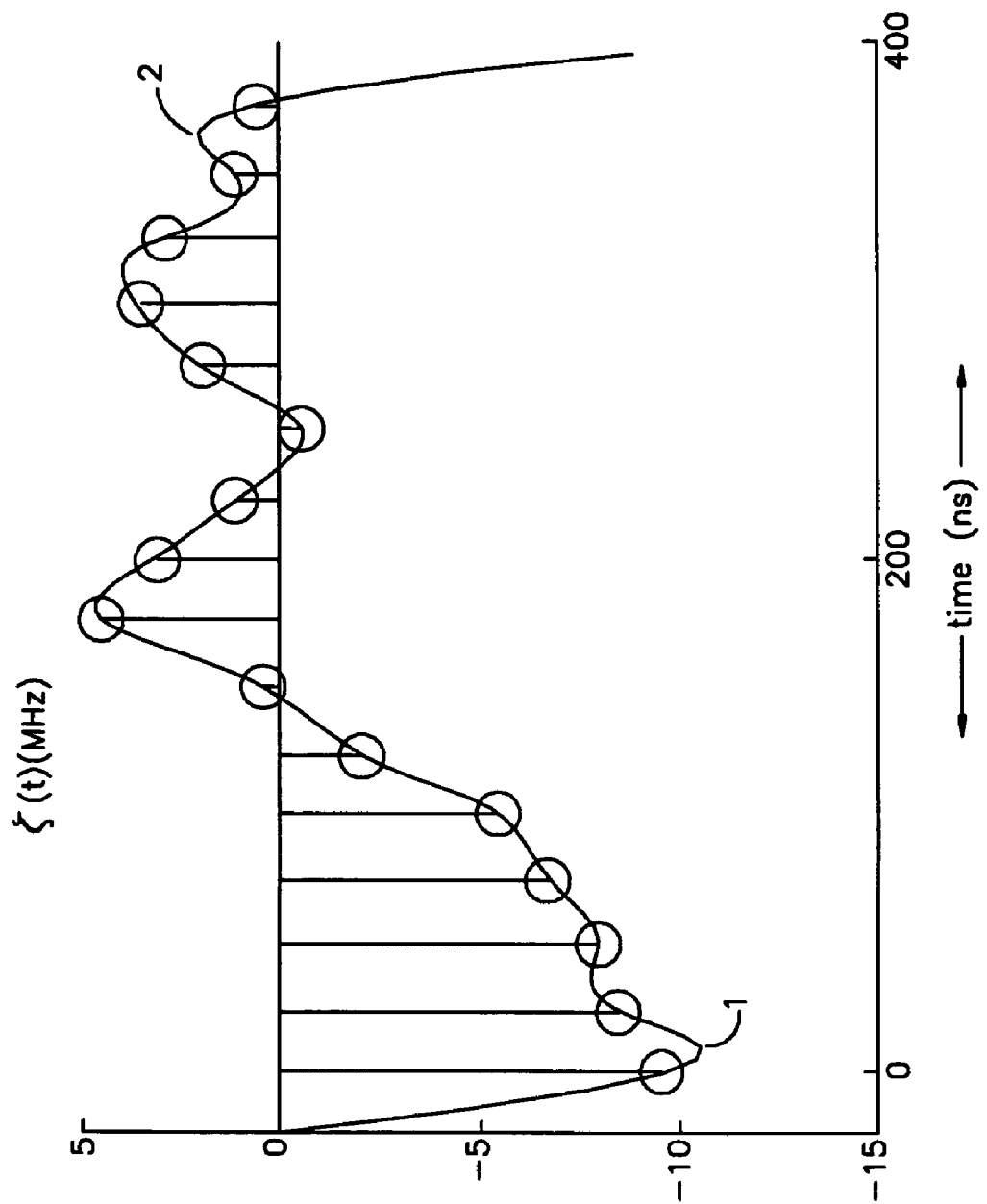
FIG. 2 is a schematic representation of the data of FIG. 1 modified by the example system.

FIG. 2 illustrates the same sequence as FIG. 1, but interpolated using "cosine interpolation". The smooth signal is a sum of sinusoids that passes through each discrete point. There are sharp excursions and tails on the ends denoted by 1 and 2. This is commonly referred to as Gibb's Phenomenon and results from the implicit periodicity of a Fourier technique attempting to bridge a discontinuity.

Figure 3:
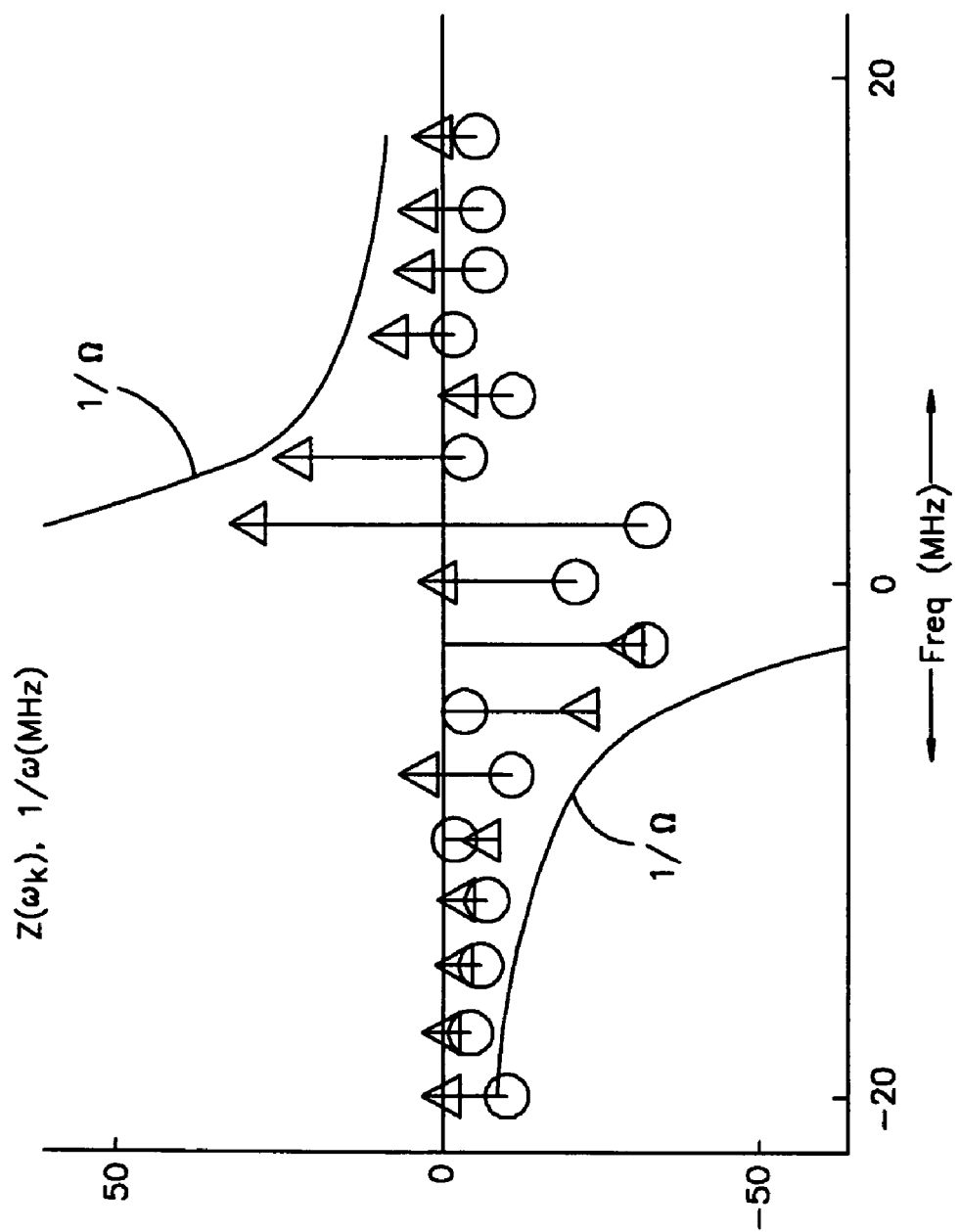
FIG. 3 is a schematic representation of the modified data of FIG. 2 further modified by the example system.

FIG. 3 illustrates the in-phase and quadrature magnitudes of example sinusoids that compose the smooth signal in FIG. 2. The system obtains Fourier coefficients via DFT (Discrete Fourier Transform) of frequency vs. time data such as FIG. 1.

The hyperbola represents a reciprocal of a frequency used to compute a time-domain integral.

Figure 4:
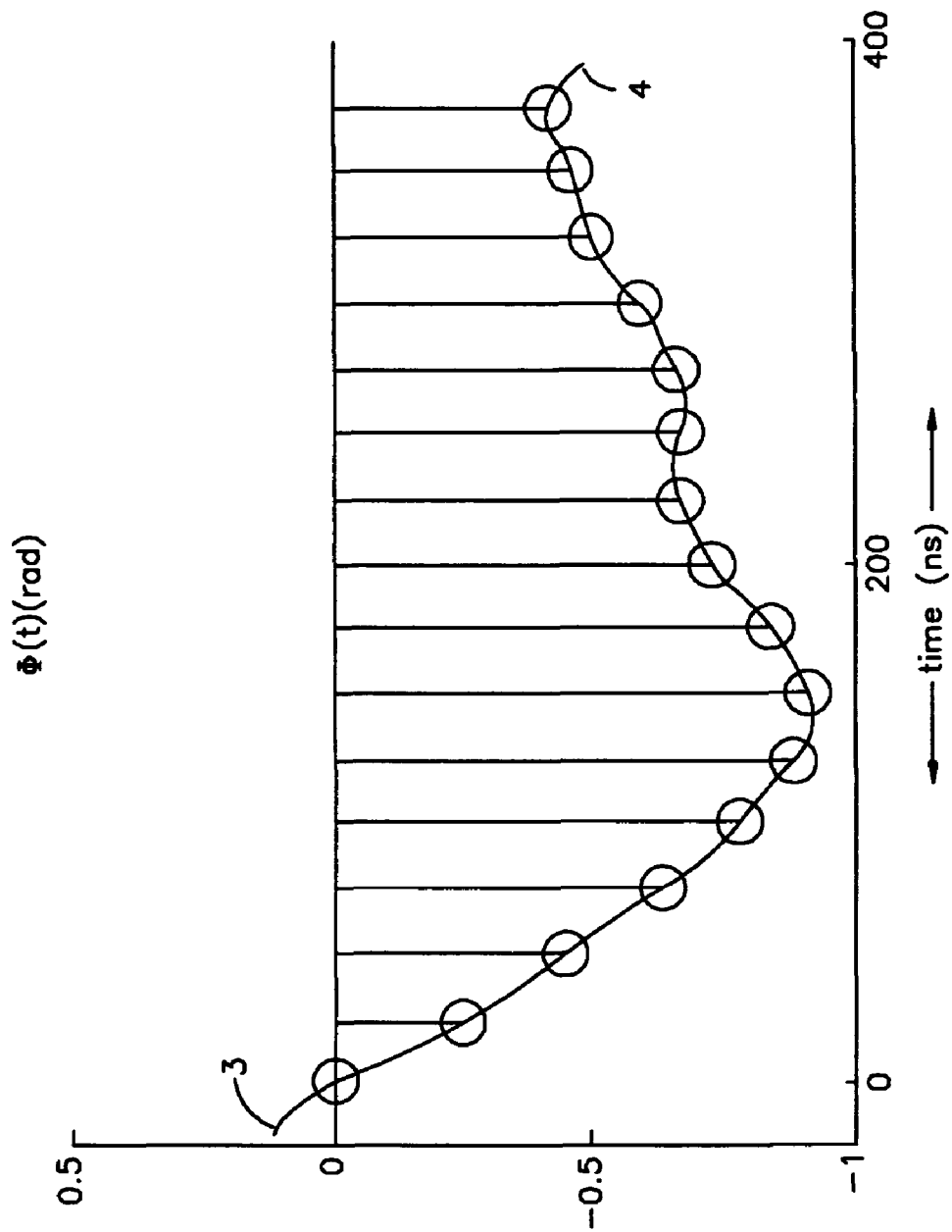
FIG. 4 is a schematic representation of the modified data of FIG. 2 further modified by the example system.
Figure 5:
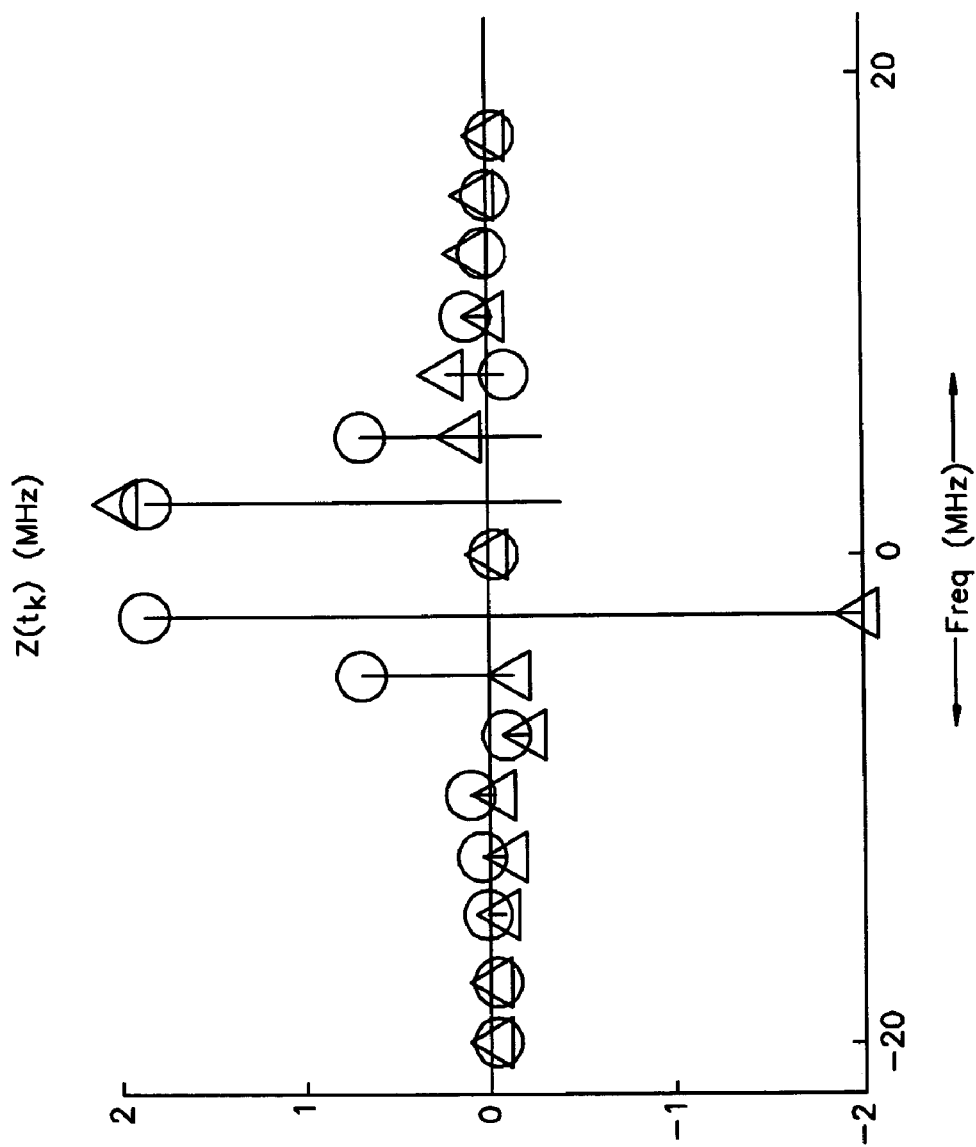
FIG. 5 is a schematic representation of the modified data of FIG. 3 further modified by the example system.

FIG. 4 illustrates a resulting phase obtained by integrating the curve in FIG. 2. The integration was executed by scaling by 1/jω in the frequency domain. The curved tails (3, 4) result from Gibb's Phenomenon described above and shown in FIG. 2. Although FIG. 4 shows a phase being computed at the same discrete time points as the original samples, it may be useful to sample the curve more densely (which can be done because the points are sampled from a continuous function). However, the curved tails (3, 4) may cause difficulties when sampling beyond the end points shown in FIG. 4. FIG. 5 illustrates the points of FIG. 3 scaled by 1/jω.

Figure 6:
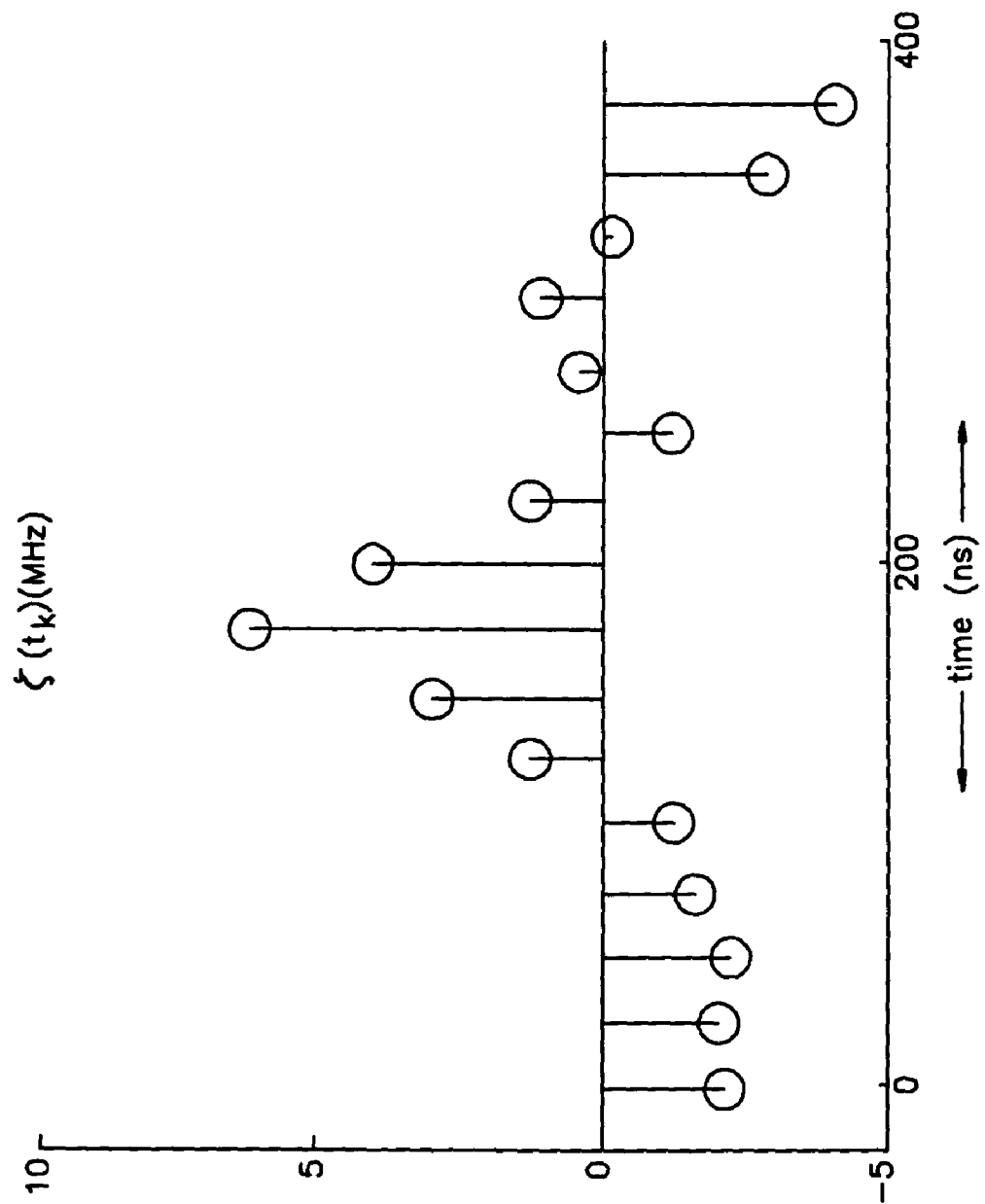
FIG. 6 is a schematic representation of non-linear data for use with the example system.
Figure 7:
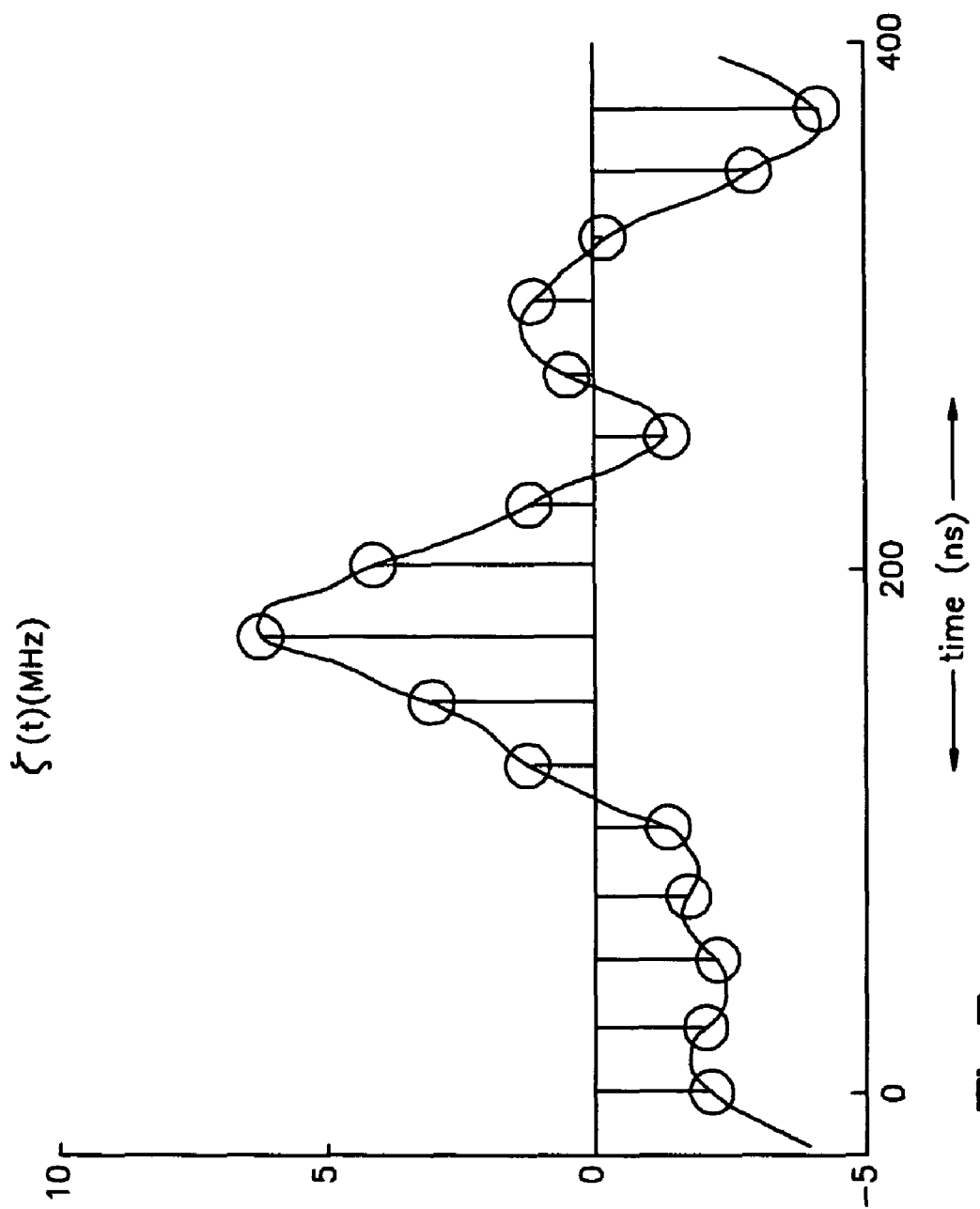
FIG. 7 is a schematic representation of the data of FIG. 6 modified by the example system.

FIG. 6 illustrates the same frequency vs. time sequence as in FIG. 1, but with the linear component removed such that the sequence has a zero mean and a net slope of zero. FIG. 7 illustrates the same sequence as FIG. 6, but interpolated using "cosine interpolation". Note that the excursions and tails are not as pronounced as in FIG. 2.

Figure 8:
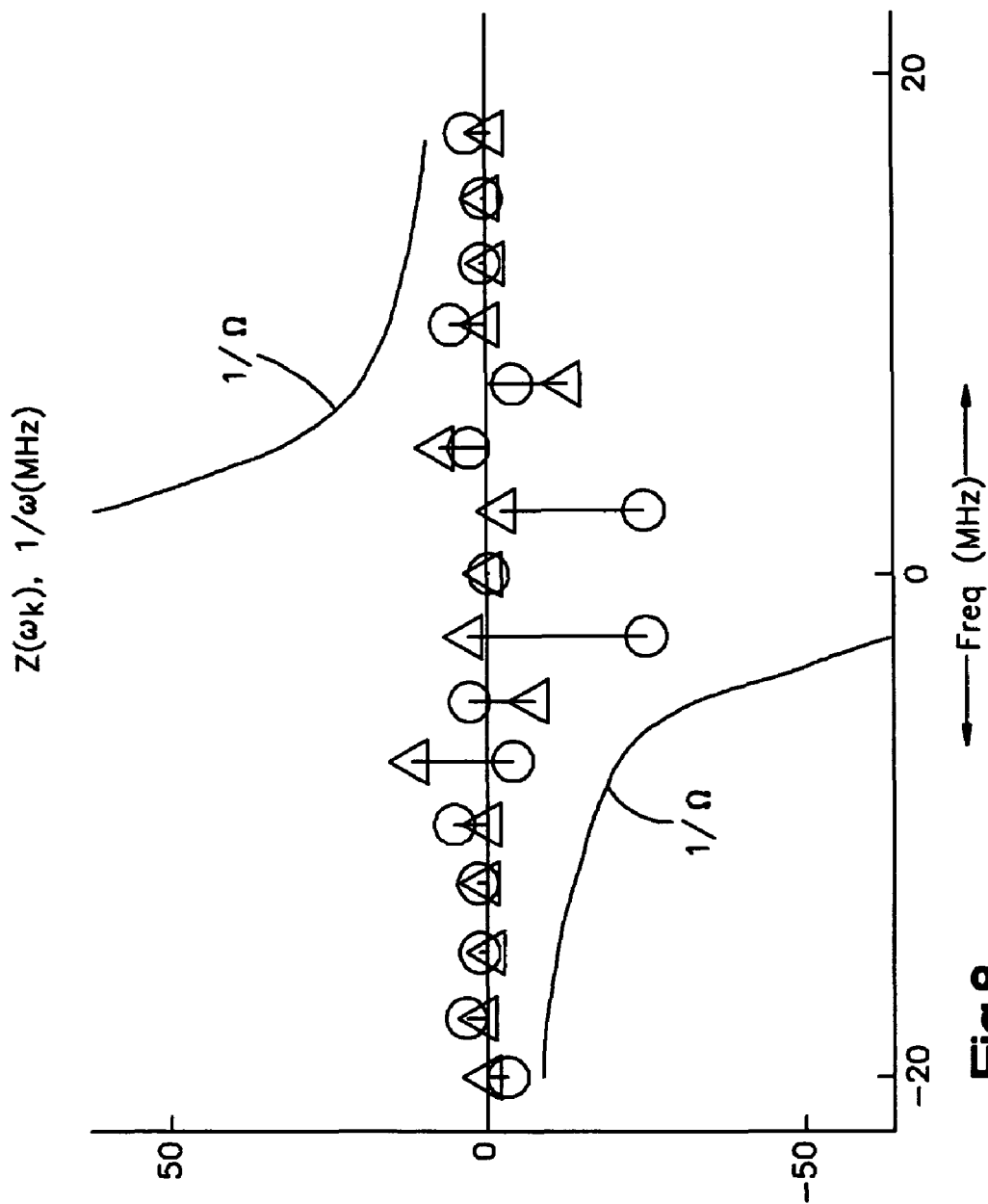
FIG. 8 is a schematic representation of the modified data of FIG. 7 further modified by the example system.

FIG. 8 illustrates the in-phase and quadrature magnitude of the various sinusoids that compose the smooth signal in FIG. 7. Fourier coefficients are obtained via DFT (Discrete Fourier Transform) of the samples of FIG. 1. The hyperbola represents the reciprocal of the frequency used to compute a time-domain integral.

Figure 9:
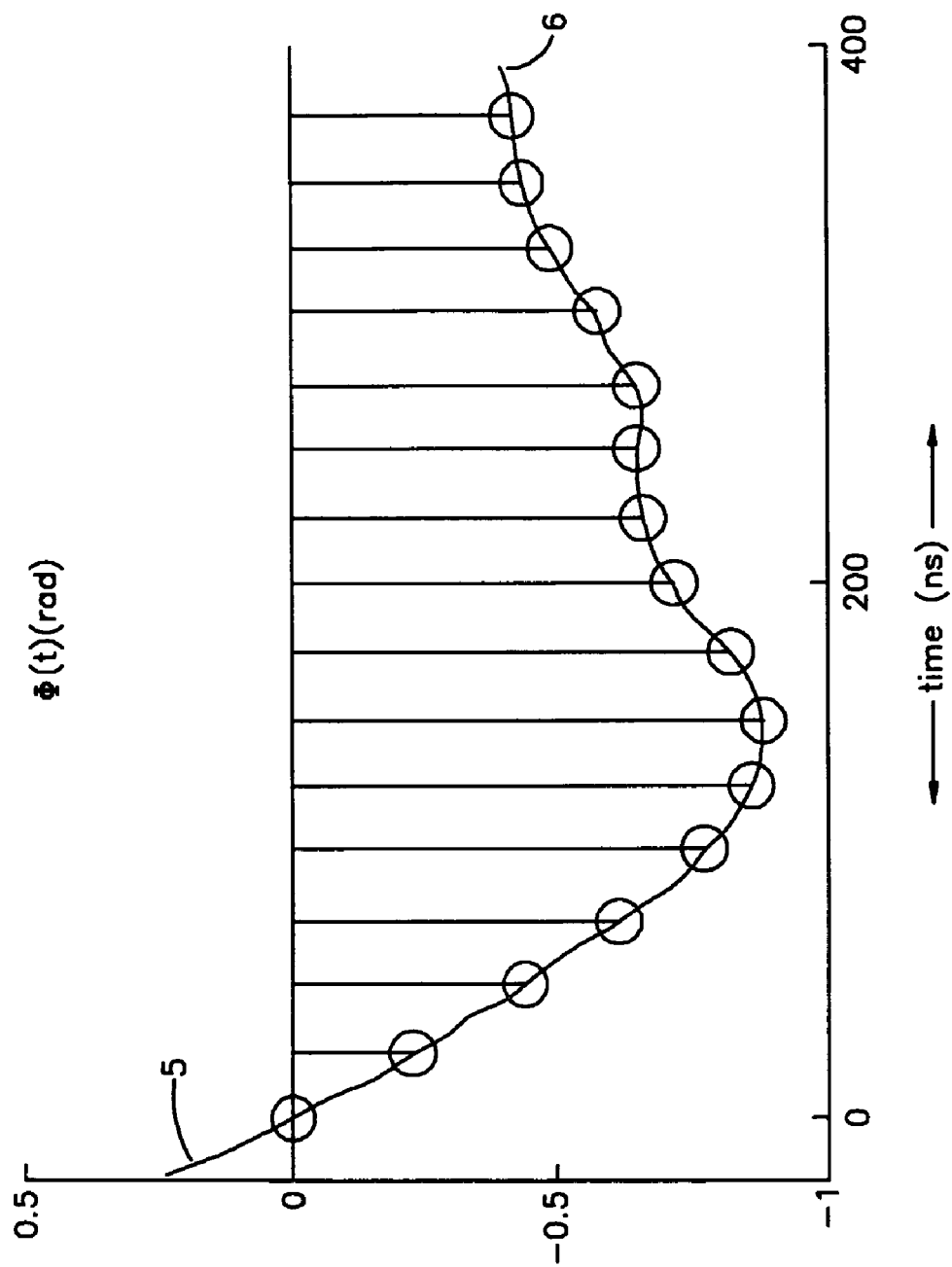
FIG. 9 is a schematic representation of the modified data of FIG. 7 further modified by the example system.
Figure 10:
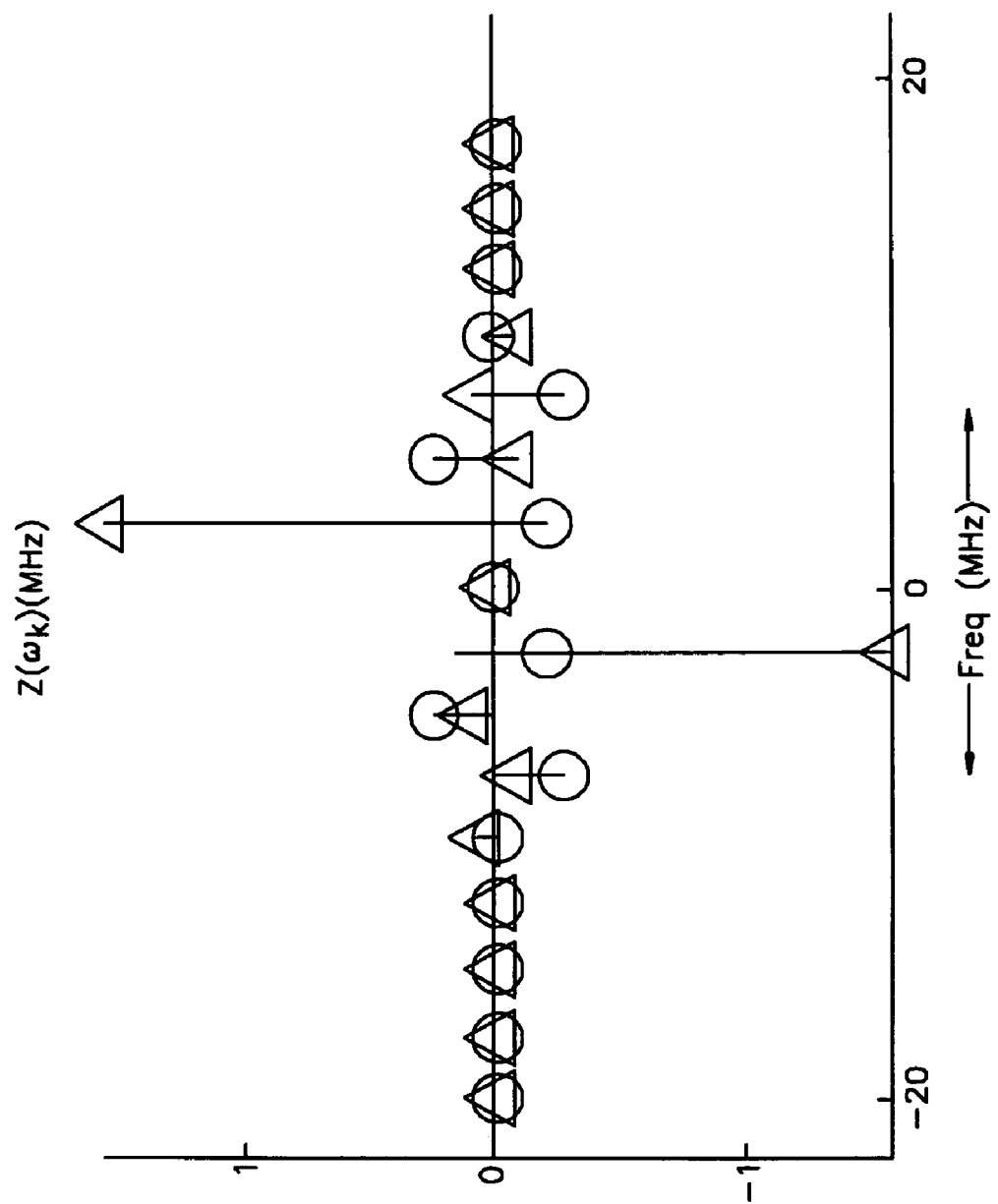
FIG. 10 is a schematic representation of the modified data of FIG. 8 further modified by the example system.

FIG. 9 illustrates a resulting phase obtained by integrating the curve in FIG. 7. However, integration was achieved by scaling by 1/jω in the frequency domain. The tails (5, 6) show a "natural" continuation of the curve. Again, this curve may easily be sampled more densely to create an analytic signal of any desired sample rate (that is greater than or equal to the initial frequency sampling rate). FIG. 10 illustrates the points of FIG. 8 scaled by 1/jω.

FIG. 11 illustrates an example system 110 in accordance with the present invention modifying digital pulse data for sampling. An FMOP vs. time sequence (FIG. 1) is presented to the example system. The samples may represent Frequency Modulation on Pulse (FMOP) as a function of time, at N discrete time instants, $\zeta(k)=\zeta(t_k)$, $t_k=kT_s$, $k=0, \ldots, N-1$, where $T_s$ is a sample period. The example system 110 may also be extended to samples with non-uniform time intervals, by replacing $t_k$ with actual sample times.

In step 111, the example system 110 computes a Discrete Fourier Transform (DFT) for the frequency:

$$Z(\omega) = \sum_{n=0}^{N-1} \zeta(t_n) e^{-j\omega t_n}, \text{ for } \omega = \omega_k = \frac{2\pi k}{NT_s}, k = -\frac{N}{2}, \ldots, \frac{N}{2} \quad \text{(FIG. 3)}$$

$$Z(k) = Z(\omega_k) = Z\left(\frac{2\pi k}{NT_s}\right).$$

Following step 111, the example system 110 proceeds to step 112.

In step 112, the example system 110 integrates the frequency to yield a phase, using the frequency domain equivalent operation $$\int \zeta(t) dt \Leftrightarrow \frac{Z(\omega)}{j\omega},$$

as follows:

$$Z^*(k) = \begin{cases} \dfrac{Z_k}{j\omega_k} & k = -\left(\dfrac{N}{2}-1\right), \ldots, -2, -1, 1, 2, \left(\dfrac{N}{2}-1\right) \\ 0, & \text{otherwise} \end{cases}$$

Following step 112, the example system 110 proceeds to step 113.

In step 113, the example system 110 represents the phase in a time domain (FIG. 4), by applying the Inverse Discrete Fourier Transform (IDFT), with modification:

$$\phi(t) = \frac{1}{N} \sum_{k=-\frac{N}{2}+1}^{\frac{N}{2}-1} Z^*(k) e^{j\omega_k t} - \overline{Z^*} + \frac{Z(0)}{N}t + \phi_0$$

$$\overline{Z^*} = \frac{1}{N} \sum_{k=-\frac{N}{2}+1}^{\frac{N}{2}-1} Z^*(k)$$

Note that specific values for t have not been selected; φ(t) is a continuous signal that may be sampled at any desired time instants. Following step 113, the example system 110 proceeds to step 114.

In step 114, the example system 110 computes a complex, or analytic, signal by applying Euler's identity ($e^{j\theta}=\cos\theta+j\sin\theta$), and applying a predetermined amplitude envelope to produce a signal with a "shape," A(t):

$$s(t)=A(t)e^{j\phi(t)}$$

Following step 114, the example system 110 proceeds to step 115.

In step 115, the example system 110 samples the signal at uniform time intervals, T:

$$s(k)=s(kT)$$

$$Re\{s(k)\}=A(kT)\cos\phi(kT)$$

$$Im\{s(k)\}=A(kT)\sin\phi(kT)$$

This sample interval may differ from the FMOP sampling interval, $T_s$, of step 111.

FIG. 12 illustrates an example system 120 in accordance with the present invention similar to the example system 110 above (FIG. 11), improving boundary continuity.

In step 121, the example system 120 removes the average slope and offset of a uniform sample FMOP sequence:

$$S = N$$

$$S_x = \sum_{k=0}^{N-1} t_k = \frac{N(N-1)}{2} T_s$$

$$S_{xx} = \sum_{k=0}^{N-1} t_k^2 = \frac{N(N-1)(2N-1)}{2} T_s$$

$$S_y = \sum_{k=0}^{N-1} \zeta_k$$

-continued $$S_{xy} = \sum_{k=0}^{N-1} \zeta_k t_k = T_s \sum_{k=0}^{N-1} k\zeta_k$$

$$\Delta = SS_{xx} - S_x^2$$

$$\zeta_1 = \frac{SS_{xy} - S_x S_y}{\Delta}$$

$$\zeta_0 = \frac{S_{xx}S_y - S_{xy}S_x}{\Delta}$$

$$\overset{0}{\zeta}(k) = \zeta(k) - \zeta_1 t_k - \zeta_0$$

Following step 121, the example system 120 proceeds to step 122.

In step 122, the example system 120 applies the integration technique as illustrated by steps 111, 112, and 113 of FIG. 11, using $$\overset{0}{\zeta}(k)$$

as an input instead of ζ(k), and yielding $$\overset{0}{\phi}(t)$$

instead of φ(t). Following step 122, the example system 120 proceeds to step 123.

In step 123, the example system 120 reapplies the slope and offset, which in terms of phase, is a quadratic following the integration step 122.

$$\phi(t) = \overset{0}{\phi}(t) + \frac{\zeta_1}{2} + \zeta_0$$

Following step 123, the example system proceeds to step 124.

In step 124, the example system 120 executes an analytic signal computation and sample as in steps 114 and 115 of FIG. 11.

In order to provide a context for the various aspects of the present invention, the following discussion is intended to provide a brief, general description of a suitable computing environment in which the various aspects of the present invention may be implemented. While the invention has been described above in the general context of computer-executable instructions of a computer program that runs on a computer, those skilled in the art will recognize that the invention also may be implemented in combination with other program modules.

Generally, program modules include routines, programs, components, data structures, etc. that perform particular tasks or implement particular abstract data types. Moreover, those skilled in the art will appreciate that the inventive methods may be practiced with other computer system configurations, including single-processor or multiprocessor computer systems, minicomputers, mainframe computers, as well as personal computers, hand-held computing devices, microprocessor-based or programmable consumer electronics, and the like. The illustrated aspects of the invention may also be practiced in distributed computing environments where tasks are performed by remote processing devices that are linked through a communications argument model. However, some, if not all aspects of the invention can be practiced on stand-alone computers. In a distributed computing environment, program modules may be located in both local and remote memory storage devices.

An exemplary system for implementing the various aspects of the invention includes a conventional server computer, including a processing unit, a system memory, and a system bus that couples various system components including the system memory to the processing unit. The processing unit may be any of various commercially available processors. Dual microprocessors and other multi-processor architectures also can be used as the processing unit. The system bus may be any of several types of bus structure including a memory bus or memory controller, a peripheral bus, and a local bus using any of a variety of conventional bus architectures. The system memory includes read only memory (ROM) and random access memory (RAM). A basic input/output system (BIOS), containing the basic routines that help to transfer information between elements within the server computer, such as during start-up, is stored in ROM.

The server computer further includes a hard disk drive, a magnetic disk drive, e.g., to read from or write to a removable disk, and an optical disk drive, e.g., for reading a CD-ROM disk or to read from or write to other optical media. The hard disk drive, magnetic disk drive, and optical disk drive are connected to the system bus by a hard disk drive interface, a magnetic disk drive interface, and an optical drive interface, respectively. The drives and their associated computer-readable media provide nonvolatile storage of data, data structures, computer-executable instructions, etc., for the server computer. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, may also be used in the exemplary operating environment, and further that any such media may contain computer-executable instructions for performing the methods of the present invention.

A number of program modules may be stored in the drives and RAM, including an operating system, one or more application programs, other program modules, and program data. A user may enter commands and information into the server computer through a keyboard and a pointing device, such as a mouse. Other input devices (not shown) may include a microphone, a joystick, a game pad, a satellite dish, a scanner, or the like. These and other input devices are often connected to the processing unit through a serial port interface that is coupled to the system bus, but may be connected by other interfaces, such as a parallel port, a game port or a universal serial bus (USB). A monitor or other type of display device is also connected to the system bus via an interface, such as a video adapter. In addition to the monitor, computers typically include other peripheral output devices (not shown), such as speaker and printers.

The server computer may operate in a networked environment using logical connections to one or more remote computers, such as a remote client computer. The remote computer may be a workstation, a server computer, a router, a peer device or other common network node, and typically includes many or all of the elements described relative to the server computer. The logical connections include a local area network (LAN) and a wide area network (WAN). Such networking environments are commonplace in offices, enterprise-wide computer networks, intranets and the internet.

When used in a LAN networking environment, the server computer is connected to the local network through a network interface or adapter. When used in a WAN networking environment, the server computer typically includes a modem, or is connected to a communications server on the LAN, or has other means for establishing communications over the wide area network, such as the internet. The modem, which may be internal or external, is connected to the system bus via the serial port interface. In a networked environment, program modules depicted relative to the server computer, or portions thereof, may be stored in the remote memory storage device. It will be appreciated that the network connections shown are exemplary and other means of establishing a communications link between the computers may be used.

In accordance with the practices of persons skilled in the art of computer programming, the present invention has been described with reference to acts and symbolic representations of operations that are performed by a computer, such as the server computer, unless otherwise indicated. Such acts and operations are sometimes referred to as being computer-executed. It will be appreciated that the acts and symbolically represented operations include the manipulation by the processing unit of electrical signals representing data bits which causes a resulting transformation or reduction of the electrical signal representation, and the maintenance of data bits at memory locations in the memory system (including the system memory, hard drive, floppy disks, and CD-ROM) to thereby reconfigure or otherwise alter the computer system's operation, as well as other processing of signals. The memory locations where such data bits are maintained are physical locations that have particular electrical, magnetic, or optical properties corresponding to the data bits.

It will be understood that the above description of the present invention is susceptible to various modifications, changes and adaptations, and the same are intended to be comprehended within the meaning and range of equivalents of the appended claims. The presently disclosed embodiments are considered in all respects to be illustrative, and not restrictive. The scope of the invention is indicated by the appended claims, rather than the foregoing description, and all changes that come within the meaning and range of equivalence thereof are intended to be embraced therein.

I claim:

1. A system for generating phase data representing a digital pulse, said system comprising:

a processor for computing a discrete Fourier transform of frequency data of the digital pulse, the discrete Fourier transform comprising a first output represented by:

$$Z(\omega) = \sum_{n=0}^{N-1} \zeta(t_n) e^{-j\omega t_n}, \text{ for } \omega = \omega_k = \frac{2\pi k}{NT_s}, k = -\frac{N}{2}, \ldots, \frac{N}{2}$$

$$Z(k) = Z(\omega_k) = Z\left(\frac{2\pi k}{NT_s}\right);$$

wherein $Z(\omega)$ is a frequency domain representation of the frequency data of the digital pulse, $\zeta(t_n)$ is an instantaneous frequency of the digital pulse at a time, $t_n$, N is a number of samples in the discrete Fourier transform, and $T_s$ is an interval between samples in the discrete Fourier transform;

a scaling component that scales the first output to produce a second output representing the phase data in the frequency domain;

a converter for applying an inverse discrete Fourier transform to the second output to produce a continuous signal configured to be sampled at a predetermined time instant, the continuous signal comprising a third output; and a transmitter configured to generate an output pulse from the third output.

2. The system as set forth in claim 1 wherein the processor removes a slope and an offset from the frequency data of the digital pulse.

3. The system as set forth in claim 2 further including a second converter for reapplying the slope and the offset of the frequency data of the digital pulse to the third output, the second converter producing a fourth output.

4. The system as set forth in claim 3 wherein the fourth output comprises a quadratic represented by $$\phi(t) = \overset{0}{\phi}(t) + \frac{\zeta_1}{2}t^2 + \zeta_0;$$

wherein $\phi^0(t)$ is an initial phase associated with the digital pulse, $\zeta_1$ is a coefficient representing the slope of the frequency data, and $\zeta_0$ is a coefficient representing the offset of the frequency data.

5. The system as set forth in claim 1 wherein the scaling component utilizes the frequency domain equivalent operation $$\int \zeta(t) dt \Leftrightarrow \frac{Z(\omega)}{j\omega}$$

such that $$Z^*(k) = \begin{cases} \frac{Z_k}{j\omega_k}, & k = -\left(\frac{N}{2}-1\right), \ldots, -2, -1, 1, 2, \left(\frac{N}{2}-1\right) \\ 0, & \text{otherwise} \end{cases};$$

wherein $Z(\omega)$ is a frequency domain representation of the digital pulse, $\zeta(t)$ is an instantaneous frequency of the digital pulse at a time, t, and N is a number of samples in the discrete Fourier transform.

6. The system as set forth in claim 1 wherein the converter represents the third output in a time domain such that $$\phi(t) = \frac{1}{N} \sum_{k=-\frac{N}{2}+1}^{\frac{N}{2}-1} Z^*(k) e^{j\omega_k t} - \overline{Z^*} + \frac{Z(0)}{N} t + \phi_0$$

$$\overline{Z^*} = \frac{1}{N} \sum_{k=-\frac{N}{2}+1}^{\frac{N}{2}-1} Z^*(k);$$

wherein Z is a frequency domain representation of the digital pulse, $Z^*$ is a scaled representation of the digital pulse, k is an index used in the summation, $\zeta(t)$ is an instantaneous frequency of the digital pulse at a time, t, and N is a number of samples in the discrete Fourier transform.

7. The system as set forth in claim 1 further including a second processor for computing an analytic signal by applying Euler's identity ($e^{j\theta}=\cos\theta+j\sin\theta$) to the third output, the second processor producing a fourth output.

8. The system as set forth in claim 7 wherein the second processor applies a predetermined amplitude envelope to produce a signal with a "shape," A(t), defined by $s(t)=A(t)e^{j\phi(t)}$;

wherein s(t) is the signal and $\phi(t)$ is a phase of the signal.

9. The system as set forth in claim 7 further including a sampler for sampling the fourth output at uniform time intervals, T, such that $$s(k)=s(kT)$$

$$Re\{s(k)\}=A(kT)\cos\phi(kT) s(t)=A(t)e^{j\phi(t)};$$

$$Im\{s(k)\}=A(kT)\sin\phi(kT)$$

wherein s(t) is the signal at a time t, k is an index, A(t) is the "shape" of the amplitude envelope at a time t, and $\phi(t)$ is a phase of the signal at a time t.

10. A non-transitory computer readable medium, containing executable instructions configured to be executed in a computer processor, for generating phase data representing a digital pulse, said executable instructions comprising:

a first instruction for computing a discrete Fourier transform of frequency data of the digital pulse;

a second instruction for removing a slope and an offset from the frequency data from the transformed frequency data as to produce a first output;

a third instruction for scaling the first output to produce phase data for the digital pulse in the frequency domain, the third instruction producing a second output;

a fourth instruction for reapplying the slope and the offset of the frequency data of the digital pulse to the second output, the fourth instruction producing a third output, comprising a quadratic represented by:

$$\phi(t) = \overset{0}{\phi}(t) + \frac{\zeta_1}{2}t^2 + \zeta_0;$$

wherein $Z(\omega)$ is a frequency domain representation of the frequency data of the digital pulse, $\zeta(t_n)$ is an instantaneous frequency of the digital pulse at a time, $t_n$, N is a number of samples in the discrete Fourier transform, and $T_s$ is an interval between samples in the discrete Fourier transform;

a fifth instruction for applying an inverse discrete Fourier transform to the third output to produce a continuous signal that may be sampled at any predetermined time instant, the fifth instruction producing a fourth output; and a sixth instruction for generating an output pulse for transmission from the fourth output.

11. The non-transitory computer readable medium as set forth in claim 10 wherein the discrete Fourier transform of frequency data of the digital pulse is represented by $$Z(\omega) = \sum_{n=0}^{N-1} \zeta(t_n)e^{-j\omega t_n}, \text{ for } \omega = \omega_k = \frac{2\pi k}{NT_s}, k = -\frac{N}{2}, \ldots, \frac{N}{2}$$

-continued $$Z(k) = Z(\omega_k) = Z\left(\frac{2\pi k}{NT_s}\right);$$

wherein $Z(\omega)$ is a frequency domain representation of the frequency data of the digital pulse, $\zeta(t_n)$ is an instantaneous frequency of the digital pulse at a time, $t_n$, N is a number of samples in the discrete Fourier transform, and $T_s$ is an interval between samples in the discrete Fourier transform.

12. The non-transitory computer readable medium as set forth in claim 10 wherein the third instruction further utilizes the frequency domain equivalent operation $$\int \zeta(t)dt \Leftrightarrow \frac{Z(\omega)}{j\omega}$$

such that $$Z^*(k) = \begin{cases} \frac{Z_k}{j\omega_k}, & k = -\left(\frac{N}{2}-1\right), \ldots, -2, -1, 1, 2, \left(\frac{N}{2}-1\right) \\ 0, & \text{otherwise} \end{cases};$$

wherein $Z(\omega)$ is a frequency domain representation of the digital pulse, $\zeta(t)$ is an instantaneous frequency of the digital pulse at a time, t, and N is a number of samples in the discrete Fourier transform.

13. The non-transitory computer readable medium as set forth in claim 10 wherein the fifth instruction further represents the third output in a time domain such that $$\phi(t) = \frac{1}{N}\sum_{k=-\frac{N}{2}+1}^{\frac{N}{2}-1} Z^*(k)e^{j\omega_k t} - \overline{Z^*} + \frac{Z(0)}{N}t + \phi_0$$

$$\overline{Z^*} = \frac{1}{N}\sum_{k=-\frac{N}{2}+1}^{\frac{N}{2}-1} Z^*(k);$$

wherein Z is a frequency domain representation of the digital pulse, $Z^*$ is a scaled representation of the digital pulse, k is an index used in the summation, $\zeta(t)$ is an instantaneous frequency of the digital pulse at a time, t, and N is a number of samples in the discrete Fourier transform.

14. The non-transitory computer readable medium as set forth in claim 10 further including a seventh_instruction for computing an analytic signal by applying Euler's identity ($e^{j\phi}=\cos\phi+j\sin\phi$) to the fourth output, the seventh instruction producing a fifth output.

15. The non-transitory computer readable medium as set forth in claim 14 wherein the seventh instruction further applies a predetermined amplitude envelope to the analytic signal produce a combined signal with a "shape," A(t), defined by $s(t)=A(t)e^{j\phi(t)}$;

wherein s(t) is the signal and $\phi(t)$ is a phase of the signal.

16. The non-transitory computer readable medium as set forth in claim 14 further including an eighth instruction for sampling the fifth output at uniform time intervals, T, such that $$s(k)=s(kT)$$

$$Re\{s(k)\}=A(kT)\cos\phi(kT);$$

$$Im\{s(k)\}=A(kT)\sin\phi(kT)$$

wherein s(t) is the signal at a time t, k is an index, A(t) is the "shape" of the amplitude envelope at a time t, and φ(t) is a phase of the signal at a time t.

17. The non-transitory computer readable medium of claim 15, wherein the combined signal is sampled at discrete time instants to yield a pulse representation.

18. The system of claim 1, the scaling component scaling the first output by 1/jω.

19. The system of claim 2, wherein the processor determines the average slope and the offset of the frequency data of the digital pulse via a least squares regression analysis.

20. A non-transitory computer readable medium, containing executable instructions configured to be executed in a computer processor, for generating phase data for a digital pulse, said executable instructions comprising:

a first instruction for computing a discrete Fourier transform of frequency data of the digital pulse, said first instruction producing a first output;

a second instruction for integrating the first output to produce phase data, the second instruction utilizing a frequency domain equivalent operation $$\int \zeta(t)dt \Leftrightarrow \frac{Z(\omega)}{j\omega}$$

such that:

$$Z^*(k) = \begin{cases} \frac{Z_k}{j\omega_k}, & k = -\left(\frac{N}{2}-1\right), \ldots, -2, -1, 1, 2, \left(\frac{N}{2}-1\right) \\ 0, & \text{otherwise} \end{cases}$$

to produce a second output, wherein Z(ω) is a frequency domain representation of the digital pulse, ζ(t) is an instantaneous frequency of the digital pulse at a time, t, and N is a number of samples in the discrete Fourier transform;

a third instruction for applying an inverse discrete Fourier transform to the second output to produce a continuous signal configured to be sampled at any predetermined time instant, the third instruction producing a third output; and a fourth instruction for generating an output pulse for transmission from the third output.

* * * * *